United States Patent
Alpert et al.

(10) Patent No.: US 6,434,729 B1
(45) Date of Patent: Aug. 13, 2002

(54) TWO MOMENT RC DELAY METRIC FOR PERFORMANCE OPTIMIZATION

(75) Inventors: Charles Jay Alpert; Anirudh Devgan; Chandramouli V. Kashyap, all of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/542,442

(22) Filed: Apr. 4, 2000

(51) Int. Cl.[7] ............................................. G06F 17/50

(52) U.S. Cl. .................................. 716/6; 716/2; 703/14

(58) Field of Search ........................... 716/1–21; 703/2, 703/14–17, 19

(56) References Cited

U.S. PATENT DOCUMENTS

| | | | | |
|---|---|---|---|---|
| 5,392,221 A | * | 2/1995 | Donath et al. ................. | 716/6 |
| 5,559,715 A | * | 9/1996 | Misheloff ..................... | 703/19 |
| 5,659,484 A | * | 8/1997 | Bennett et al. ............... | 716/16 |
| 5,875,114 A | * | 2/1999 | Kagatani et al. .............. | 716/6 |
| 5,896,300 A | * | 4/1999 | Raghavan et al. ............. | 716/10 |
| 6,038,384 A | * | 3/2000 | Ehrler ........................... | 716/6 |
| 6,041,169 A | * | 3/2000 | Brennan ....................... | 716/6 |
| 6,088,523 A | * | 7/2000 | Nabors et al. ................ | 703/14 |
| 6,182,269 B1 | * | 1/2001 | Laubhan ....................... | 716/5 |
| 6,223,328 B1 | * | 4/2001 | Ito et al. ...................... | 716/6 |
| 6,282,693 B1 | * | 8/2001 | Naylor et al. ................ | 716/8 |
| 6,286,126 B1 | * | 9/2001 | Raghavan et al. ............ | 716/6 |
| 6,286,128 B1 | * | 9/2001 | Pileggi et al. ................ | 716/18 |
| 6,308,302 B1 | * | 10/2001 | Hathaway et al. ............ | 716/5 |
| 6,314,546 B1 | * | 11/2001 | Muddu .......................... | 716/5 |
| 6,347,393 B1 | * | 2/2002 | Alpert et al. ................. | 716/2 |

OTHER PUBLICATIONS

Kal et al., "An analytic calculation method for delay time of RC–class interconnects", Proceedings of the ASP–DAC 2000, Asia and South Pacific Design Automation Conference, Jan. 25, 2000, pp. 457–462.*

Yang et al., "RLC interconnect delay estimation via moments of amplitude and phase response", IEEE/ACM International Conference on Computer–Aided Design, Nov. 7, 1999, pp. 208–213.*

Gupta et al., "Exact output response computation of RC interconnects under polynomial input waveforms", Proceedings of Twelfth International Conference On VLSI Design, Jan. 7, 1999, pp. 160–163.*

Gupta et al., "The Elmore delay as a bound for RC trees with generalized input signals", IEEE Transactions on Computer–Aided Design of Integrated Circuits and Systems, Jan. 1997, vol. 16, No. 1, pp. 95–104.*

Yu et al., "Exact moment matching model of transmission lines and application to interconnect delay", IEEE Transactions on Very Large Scale Integration (VLSI) Systems, vol. 3, No. 2, Jun. 1995, pp. 311, 322.*

Cirit, "RC Trees Revisited", Proceedings of the IEEE 1988 Custom Integrated Circuits Conference, May 16, 1988, pp. 6.7/1–6.7/4.*

* cited by examiner

Primary Examiner—Matthew Smith
Assistant Examiner—Phallaka Kik
(74) Attorney, Agent, or Firm—Casimer K. Salys; Bracewell & Patterson, L.L.P.

(57) ABSTRACT

An efficient method for optimizing RC circuit design to reduce delay. The method comprises: calculating a first moment and a second moment of impulse response for an RC circuit; (2) computing a delay value for each node of the RC circuit utilizing the first and second moments by multiplying the natural logarithm of 2 with a division of the squared power of the first impulse moment by the square root of the second impulse moment; and (3) analyzing each node to determine if the delay at that node is at a desired optimization condition for optimizing the circuit response.

15 Claims, 3 Drawing Sheets

TWO MOMENT RC DELAY METRIC FOR PERFORMANCE OPTIMIZATION

BACKGROUND OF THE INVENTION

1. Technical Field

The present invention relates in general to computational methods utilized in analyzing circuits and in particular to a method, program, and data processing system that can efficiently and accurately measure delays in an RC circuit. Still more particularly, the present invention relates to a method, program and data processing system that can efficiently and accurately measure interconnect delays in an RC circuit to permit optimization of circuit designs.

2. Description of the Related Art

Faster performance and predictability of responses are elements of interest in circuit designs. As process technology scales to the sub-micron regime, interconnect delays increasingly dominate gate delays. Consequently, physical design optimization tools such as floorplanning, placement, and routing are becoming more "timing-driven" than the previous generation of tools. For such a tool to be effective, it must be able to efficiently compute interconnect delay since several million delay calculations are required to optimize a design.

In certain types of circuits, delays exist based on circuit topology and circuit components. Delays are particularly acute in circuits having resistive and capacitive elements, or RC circuits, as they are called in the art. Circuit designers continually search for efficient techniques for accurate estimation of these delays, while determining the particular circuit's response to a load. In particular, circuit designers want to be able to calculate reliable delay information when designing the circuit. To this end, several prior art metrics (i.e., computational methods) have been developed.

The Elmore delay metric, which calculates the first moment of the impulse response, is the most widely applied and simplest interconnect delay metric that still captures some amount of metal resistance effects. The Elmore metric provides an upper bound on delay given any input waveform because the RC circuit impulse response is unimodal and positively skewed. The Elmore delay metric is commonly utilized for performance optimization tasks such as floorplanning, placement, buffer insertion, wire sizing in part and global routing. The widespread use of the Elmore delay metric is due to its closed form expression, fast computation speed, and fidelity with respect to simulation. Closed form delay equations, such as Elmore delay metric, are certainly preferable due to both efficiency and ease of implementation, as long as they are sufficiently accurate.

Figure 3:
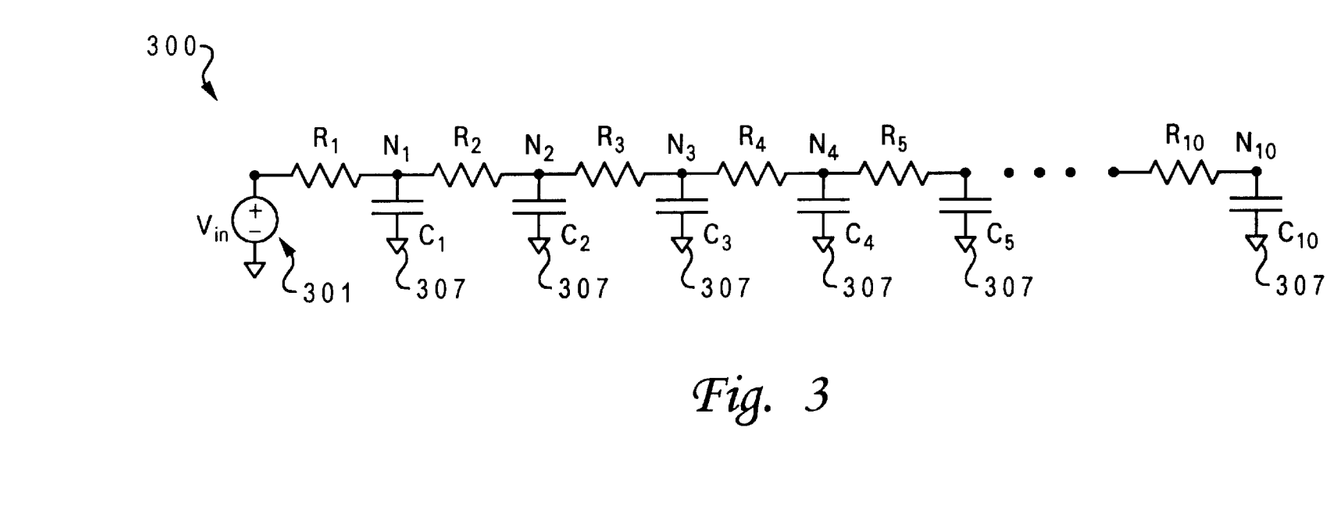
FIG. 3 depicts a typical RC circuit, which may be effectively analyzed by the present invention.

Despite its wide usage, the Elmore delay metric is known to be extremely inaccurate at times because it ignores the resistive shielding of downstream capacitance. For example, in a simple RC network as shown in FIG. 3, the Elmore delay to capacitor, C1, is independent of the resistors (R2 to R10). The higher the value of the resistors, the more downstream capacitance is shielded, i.e., the larger the error is for the Elmore approximation. Particular values may be chosen for the various circuit elements in FIG. 3, which results in arbitrarily large errors when analyzed with the Elmore delay metric. Errors of up to several hundred percent have been recorded when the Elmore delay metric is utilized for sub-micron technologies. Errors from Elmore delay metric are generally much more pronounced for near-end nodes (nodes relatively close to the power source) than for far-end nodes (nodes relatively far from the power source) since resistive shielding is not as much of a factor for far-end nodes.

To achieve greater accuracy than the Elmore delay metric can provide requires additional moments of the impulse response. However, moment matching does not directly produce a delay approximation, but rather a reduced order response, which can be solved via nonlinear iterations. These iterations tend to dominate the runtime of the entire delay computation method. Thus, several prior art methods have sought to circumvent iterations by proposing delay approximations metrics that are direct functions of the circuit moments.

Several of the other traditional metrics are known to be more accurate but are either CPU intensive or difficult to implement. For example, (1) moment matching via asymptotic waveform evaluation (AWE) is very accurate but too computationally expensive to use within a tight optimization loop, (2) two-pole variants of AWE are considerably faster and recognized to be more accurate than the Elmore delay metric, but are still relatively expensive, as Newton-Raphson iterations need to be run to find a solution. Also, their solutions may be unstable, i.e., poles may be positive; hence special care has to be taken to ensure stability, (3) "first order delay estimate", which is derived from the dominant pole and corresponding residue, also requires subsequent Newton-Raphson iterations; (4) PRIMO, which fits the moments of the impulse response to probability density functions utilizing a table lookup operation; (5) h-gamma metric which subsumes PRIMO by avoiding time-shifting the distribution functions and matching moments to the circuit's homogenous response; and (6) scaled Elmore delay metric, which shifts the Elmore approximation and the error but does not change the relative delay error problem.

Thus, there are inherent drawbacks with using the various metrics currently available for measuring delays in RC circuits. The present invention recognizes the need for greater reliability and accuracy in computing delays in a RC circuit of any topology. A method and program product and/or data processing system, which allows for efficient, reliable and non-complex computation of delay in an RC circuit to permit optimization in circuit design would be a welcome improvement. These and other benefits are presented in the present invention.

SUMMARY OF THE INVENTION

An efficient method for optimizing RC circuit design to reduce delay is disclosed. The method comprises: calculating a first moment and a second moment of impulse response for an RC circuit; (2) computing a delay value for each node of the RC circuit utilizing the first and second moments by multiplying the natural logarithm of 2 with a division of the squared power of the first impulse moment by the square root of the second impulse moment; and (3) analyzing each node to determine if the delay at that node is at a desired optimization condition for optimizing the circuit response.

In one preferred embodiment, the calculations may be utilized for optimization of the circuit design. When a node has a greater delay than the desired optimization condition, the circuit components may be changed or adjusted so that the circuit yields the desired optimization condition.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF AN ILLUSTRATIVE EMBODIMENT

Figure 1:
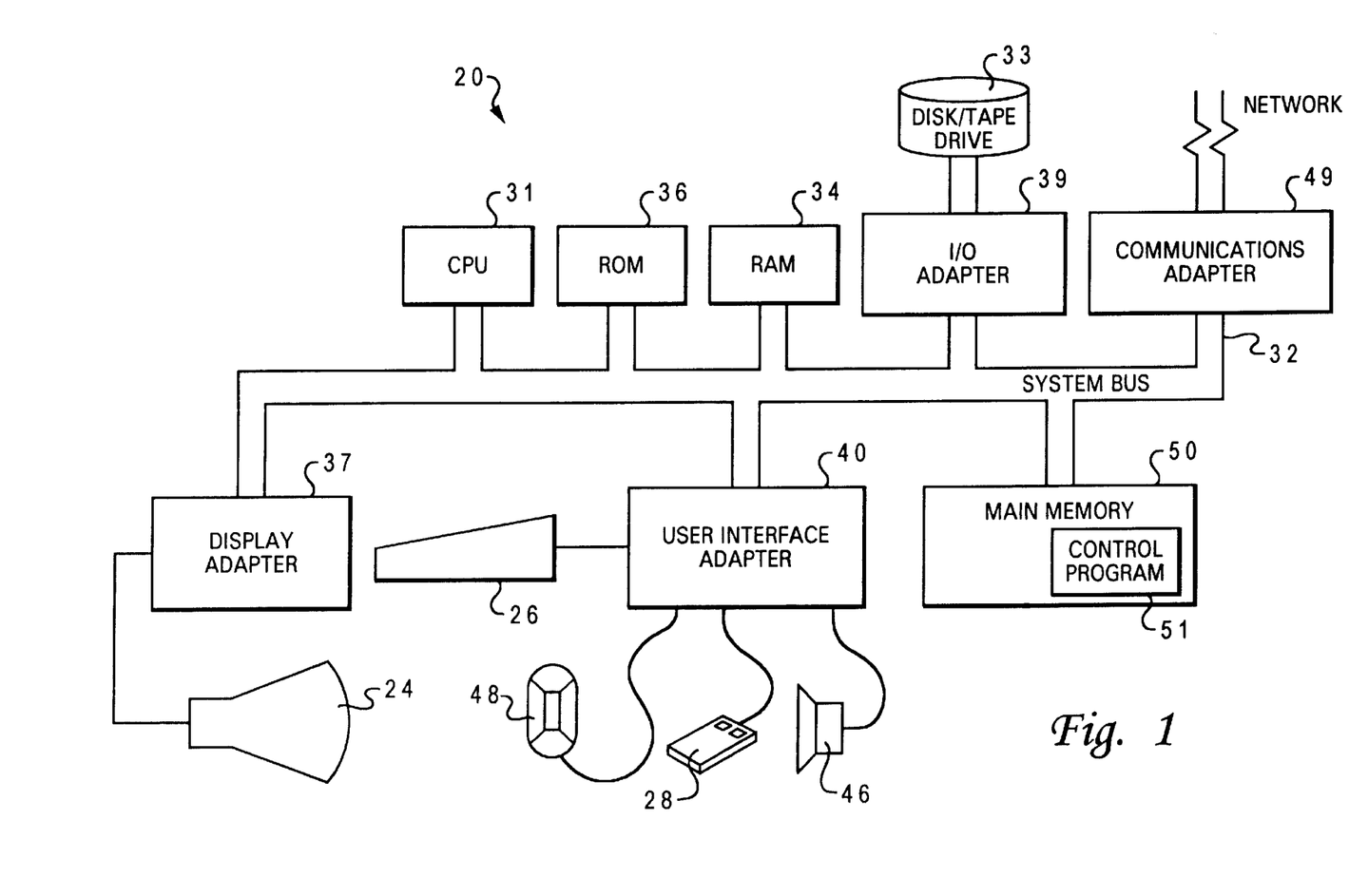
FIG. 1 illustrates a hardware environment of a computer system which may be utilized to implement a preferred embodiment of the present invention.

With reference now to the figures and in particular with reference to FIG. 1, there is depicted a block diagram representation of an illustrative embodiment of the hardware of a computer system which may be utilized to implement a preferred embodiment of the present invention. Computer system 20 includes a Central Processing Unit ("CPU") 31, such as a conventional microprocessor, and a number of other components interconnected via system bus 32. CPU 31 controls the operation of the entire computer system, including the execution of the arithmetic and logical functions contained in an operating system and other software. Although not depicted in FIG. 2, CPUs such as CPU 31 typically include a control unit that organizes data and program storage in a computer memory and transfers data and other information between the various parts of system unit 22. CPUs generally include an arithmetic unit that executes the arithmetical and logical operations, such as addition, comparison, multiplication and so forth.

Computer system 20 further includes random-access memory (RAM) 34, read-only memory (ROM) 36, a display adapter 37 for connecting system bus 32 to video display device 24, and are I/O adapter 39 for connecting peripheral devices (e.g., disks and tape drive 33) to system bus 32.

Video display device 24, connected to display adapter 37, displays the visual output of computer system 20. Video display device 24 can be a cathode-ray tube (CRT), a liquid crystal display (LCD) or gas plasma flat-panel display. Computer system 20 further includes user interface adapter 40 for connecting keyboard 26, mouse 28, speaker 46, microphone 48, and/or other user interface devices to system bus 32. Communications adapter 49 connects computer system 20 to a computer network. Although computer system 20 is depicted to contain only a single CPU and a single system bus, it should be understood that the present invention applies equally to computer systems that have multiple CPUs, and to computer systems that have different bus configurations.

Computer system 20 also includes an operating system that resides within a machine-readable media to direct the operation of computer system 20. Any suitable machine-readable media may retain the operating system, such as RAM 34, ROM 36, a magnetic diskette, magnetic tape, or optical disk (the last three can be located in disk and tape drives 33). Any suitable operating system and associated interface (e.g., Microsoft Windows or AIX) may direct CPU 31. For example, the AIX operating system and AIXwindows windowing system can direct CPU 31.

Those skilled in the art will appreciate that the hardware depicted in FIG. 1 may vary for specific applications. For example, other peripheral devices such as optical disk media, audio adapters, or chip programming devices, such as PAL or EPROM programming devices well-known in the art of computer hardware and the like, may be utilized in addition to or in place of the hardware already depicted. In addition, main memory 50 is connected to system bus 32, and includes a circuit delay analysis program 51. Circuit delay analysis program 51 normally will reside within main memory 50, and contain instructions that, when executed on CPU 31, carries out the logical operations depicted in the flow chart of FIG. 2.

It is important to note that, while the present invention has been, and will continue to be described in the context of a fully functional computer system having circuit delay analysis program 51 resident in main memory 50, those skilled in the art will appreciate that the present invention is capable of being distributed as a program product in a variety of forms, and that the present invention applies equally regardless of the particular type of signal-bearing media utilized to actually carry out the distribution. Examples of signal-bearing media include: recordable-type media, such as floppy disks, hard disk drives, and CD ROMs, and transmission-type media such as digital and analog communication links. A modem is an example of a communication device that enables computers such as computer 20 to transmit information over a transmission type media.

The present invention determines in an efficient and substantially accurate and inexpensive manner the delay estimates of circuits due to the interconnects, which are approximated by an RC circuit. The invention implements a simple closed form metric for computing RC delay and is more accurate than traditional closed form metrics, while being easier to implement for higher-order delays. Use of the metric of the present invention, instead of the traditional metrics, such as the Elmore delay metric, improves the quality (i.e., accuracy and reliability) of design optimization tools. In one embodiment, the computation steps of the invention may be implemented as program code using a program language, such as C++.

The ease with which the invention is implemented permits a designer to efficiently analyze multiple design topologies to obtain the best or most efficient topology of a circuit. The invention thus finds applicability in determining the best path to route wires/interconnects within the circuit, the placement of logic blocks within the circuit, sizing of wires used within the circuit, etc.

The RC delay metric utilized in the present invention is referred to as D2M, an acronym for "delay with 2 moments," and is defined by:

$$D2M = \frac{m_1^2}{\sqrt{m_2}} \ln 2, \qquad \text{Eq. 1}$$

where $m_1$ and $m_2$ are the first two moments of the impulse response, and calculated as $$m_0 = 1; \text{ and} \qquad \text{Eq. 2}$$

$$m_j^i = -\sum_{k=1}^{N} R_{ki} C_k m_{j-1}^k \qquad \text{Eq. 3}$$

Here, $m_j^i$ is the $j^{th}$ moment for node i. $R_{ki}$ is the total resistance of the portion of the unique path from the source to note i that overlaps with node k.

Therefore, D2M is a delay metric for RC trees that is a simple function of two moments of the impulse response. D2M is significantly more accurate than the Elmore delay metric since the magnitude of the errors for D2M are significantly less than those of the Elmore delay metric. D2M is also more accurate than other delay metrics that can be represented as functions of the first few moments. Theoretically, D2M is bounded above by the Elmore delay, and it is rarely more than a few percent below the actual delay. In design analysis, D2M is extremely accurate at the far end of RC lines.

Figure 4:
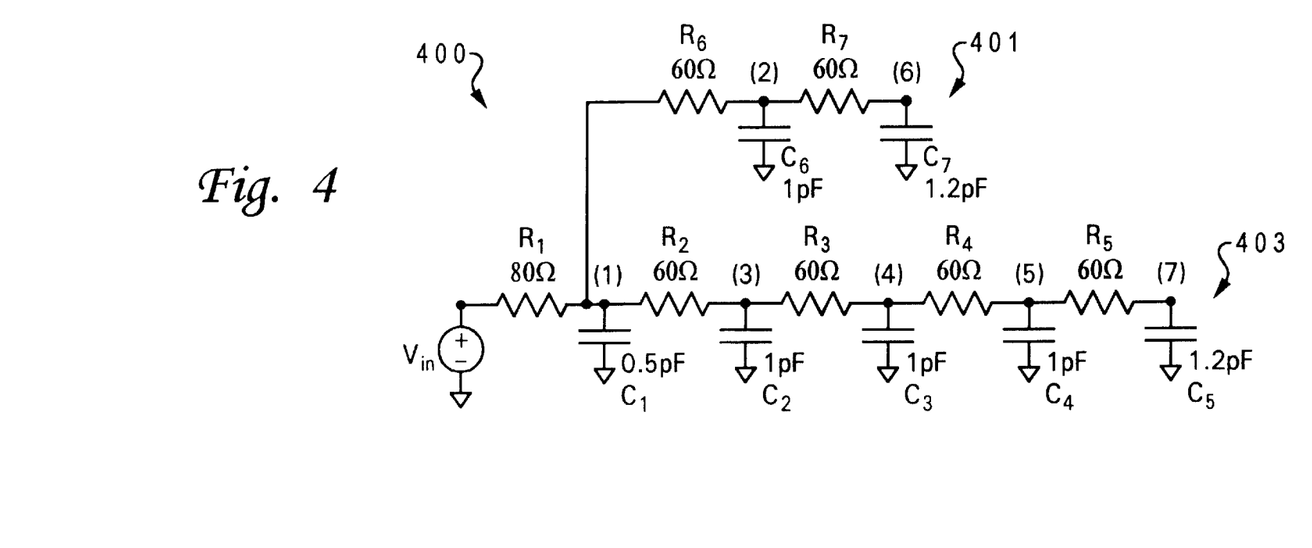
FIG. 4 depicts an RC circuit with a 2-branch tree structure, which may be effectively analyzed by the present invention.

The present invention operates on RC circuits, such as is illustrated in FIGS. 3 and 4. FIG. 3 depicts a single line RC circuit 300 with ten nodes (N1–N10), each of which comprises an interconnection point between a resistor-capacitor pair. Each resistor (R1–R10) is coupled to a corresponding capacitor (C1–C10), which is in turn connected to ground (or low voltage node) 307. At first node N1, RC circuit 300 is connected to voltage supply 301. FIG. 4 depicts a seven node, two-line RC circuit 400, having a first line 401 and second line 403 of RC components. Other circuit types are also possible and these presented herein are done so for illustrative purposes only.

Figure 2:
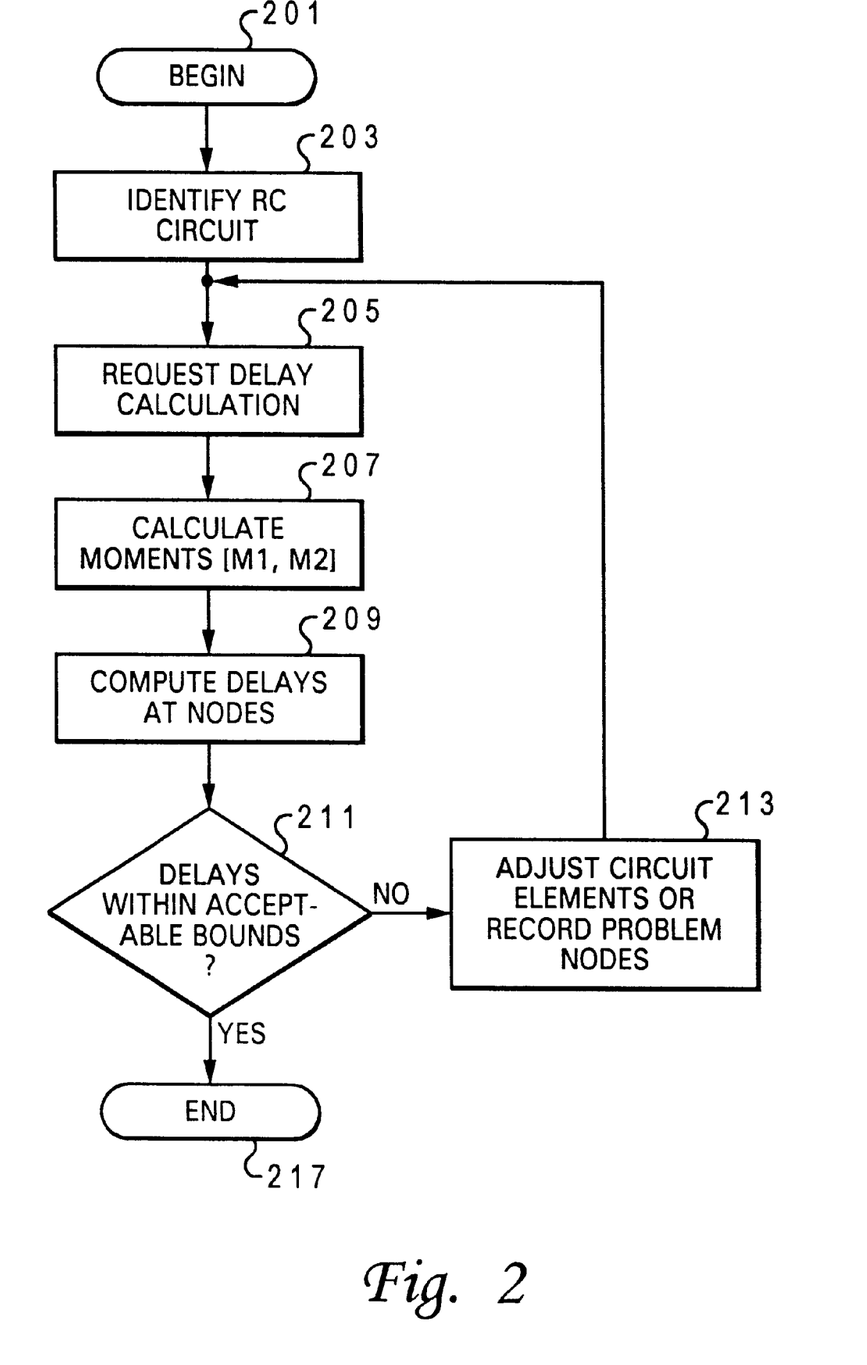
FIG. 2 depicts a flow diagram that illustrates basic steps utilized to carry out the method of the present invention.

Referring now to FIG. 2, there is depicted a high level logical flow chart of a process by which optimization of a circuit design is performed utilizing a D2M computation for RC circuit delay. The method of the present invention may be implemented by the computer system depicted in FIG. 1. As depicted in FIG. 2, the process starts at block 201 and thereafter proceeds to block 203. An RC circuit is first identified or generated at block 203. A delay calculation request is then received at block 205. To provide the argument for the D2M calculation, the first two moments of the impulse response, $m_1$ and $m_2$, are calculated at block 207. The two moments are then utilized to compute the delays at the nodes within the RC circuit at block 209. A check is made to determine if the calculated delays are within acceptable design bounds (or optimization conditions) at block 211. If the calculated delays are not within the desired design bounds, the circuit elements may be adjusted at block 213 and the process returned to block 205, where another delay calculation may be completed. Otherwise, the process ends at block 217.

In block 211, the acceptable design bounds are established by a circuit designer who may be conducting the delay analysis. The circuit designer establishes a maximum delay value desired for the overall circuit and the individual nodes of the circuit. These values may be arbitrarily selected or based on pre-established circuit design parameters. When the circuit or nodes within the circuit fails to meet the desired delay values, i.e., the circuit or node exhibits larger than desired delays, the designer adjusts the circuit by changing a value of the resistance or capacitance at within the circuit or node, or changing to layout of the circuit connectors, i.e., the routing location of the connectors, etc. Of course, the invention may also be utilized to analyzed an already designed circuit and inform the user of the circuit of the associated delays expected with the circuit.

An analysis of D2M yields the following characteristics:

(1) calculated D2M values are strictly less than that of the Elmore Delay; and (2) For RC lines, D2M metric is empirically never within 2% to the Elmore delay.

An alternative way to view this D2M metric is as a single-pole approximation in which the dominant pole, $P_1$, is $$\frac{-\sqrt{m_2}}{m_1^2}$$

and the residue, $k_1$, is one. Solving the equation, $$\text{Time delay} = -\frac{1}{p_1} \ln(2k_1), \qquad \text{Eq. 4}$$

at the 50% delay point with these values yields the D2M metric. By viewing D2M as a single-pole approximation, it can be extended to delay points other than the 50% delay. For example, the 10–90 output slew would be given by $$\text{slew} = \frac{m_1^2}{\sqrt{m_2}}\left(\ln 10 - \ln\frac{10}{9}\right) \qquad \text{Eq. 5}$$

Experimental Results

Comparisons of the D2M metric with the Elmore delay and to four other higher-order closed form metrics were performed and the results tabulated. Each of the metrics were derived from a single-pole approximation for a different dominant pole and residue.

The higher-order closed form metrics utilized were:

$$(1)\ DM1 = \frac{1}{2}\left(-m_1 + \sqrt{4m_2 - 3m_1^2}\right)\ln\left(1 - \frac{m_1}{\sqrt{4m_2 - 3m_1^2}}\right) \qquad \text{Eq. 6}$$

$$(2)\ DM2 = \sqrt{2m_2 - m_1^2}\ \ln(2); \qquad \text{Eq. 7}$$

The other 2 equations, which represent DM3 and DM4 are somewhat more complex and are presented in Tutuiana, B. et al., "Explicit RC-Circuit Delay Approximation Based on the First Three Moments of the Impulse Response", IEEE/ACM Design Automation Conference, 1996, pp. 611–616, which is hereby incorporated by reference.

A. Single-Sink Comparisons with Closed Form Metrics

The first set of experiments analyzed the difference between D2M and other proposed closed form metrics, DM1–DM4. A random 10 RC single-line circuit as illustrated in FIG. 3, was generated. Each resistor (R1–R10) and capacitor (C1 to C10) was randomly chosen between 1–20 kΩ and 1–20 fF, respectively. Using an RC single-line circuit enables tracking of accuracy trends from near-end to far-end nodes, as the nodes at the near end will have significant resistive shielding from the far end capacitance. In the analysis it is assumed that node 1 is the node closest to the voltage source, node 2, N2 the second closest, etc.

An AS/X electrical simulator was applied to the circuit to determine the actual delays. One hundred random circuits were generated and the delay computed according to each metric and AS/X. Table I presents the average ratio of each delay metric to the AS/X delay over all 100 circuits. A value close to one shows excellent correspondence to AS/X; a value above one shows the delay was over-estimated, while a value below one shows the delay was under-estimated.

TABLE I

Average Ratio of Delay Metric to AS/X Delays

| Node | D2M | Elmore | DM1 | DM2 | DM3 | DM4 |
|---|---|---|---|---|---|---|
| 1 | 3.734 | 13.128 | 7.250 | 34.853 | −298.232 | −3.417 |
| 2 | 2.152 | 4.771 | 2.809 | 6.538 | −8.189 | −1.167 |
| 3 | 1.543 | 2.839 | 1.749 | 2.981 | −0.283 | −0.241 |
| 4 | 1.246 | 2.049 | 1.315 | 1.804 | 0.753 | 3.140 |
| 5 | 1 103 | 1.684 | 1.124 | 1.303 | 0.928 | 1.214 |
| 6 | 1 033 | 1.495 | 1.037 | 1.043 | 0.962 | 1.058 |
| 7 | 1.006 | 1.398 | 1.011 | 0.896 | 1.002 | 1.010 |
| 8 | 0.999 | 1.354 | 1.014 | 0.820 | 1.000 | 0.999 |
| 9 | 0.999 | 1.332 | 1.029 | 0.778 | 1.000 | 0.999 |
| 10 | 1.000 | 1.323 | 1.041 | 0.757 | 1.000 | 0.999 |

Several observations can be made from Table I. DM3 is a poor approximation at the near-end since it returns large negative values. DM4 also gives negative delay results at the near-end when zero (0) is utilized as the initial guess for the DM4 iteration; However, both DM3 and DM4 show good correlation with AS/X at the far-end.

DM2 does not appear to be any better than the Elmore delay. It is significantly worse than Elmore delay for the first two nodes, and significantly under-estimates delay at the far-end. Both DM1 and D2M are more accurate than the Elmore delay for every node, while neither under-estimates the delay. D2M is more accurate than DM1 at both the near and far-ends. At the near end (node N1), D2M overestimates delay by a factor of 3.7, DM1 overestimates delay by almost twice this value, and Elmore delay overestimates it by almost four times this value. At the far-end, the D2M delays correspond almost exactly with AS/X, while DM1 is off by roughly 2–4%.

In Table II, the minimum and maximum ratios of D2M, Elmore, and DM1 metric to AS/X for the 100 random circuits are shown, along with the standard deviation of these ratios. The second table of values does not consider DM2, DM3, and DM4 since, as shown above, they do not behave as well as the other metrics.

As shown, at node N1, for at least one RC circuit, the Elmore delay metric is a factor of greater than 100 times worse than AS/X while D2M is only about 26 times greater. At the same node, N1, DM1 is about half as bad as the Elmore delay metric. The first node RC circuit is a particularly difficult instance. Elmore delay metric always significantly overestimates delay at node N1, with the best case being a factor of 3.3 more than AS/X. DM1 is always close to twice the AS/X value; In contrast, D2M is relatively close to AS/X. Also, D2M performs exceptionally well at the far end. For example, for nodes 8–10, N8–N10, D2M is never more than 1% above or 1.6% below AS/X over all 100 circuits. Further, D2M is more stable than the other metrics as can be seen by its uniformly lower standard deviations.

B. Multi-Sink Comparisons with Closed Form Metrics

A comparison of DM1 and the Elmore delay to D2M was made on a series of randomly generated RC trees (i.e., RC-circuits with parallel branches of RC components). The random RC tree generator takes the number of RC elements and number of branches as input and generates a random tree topology with random values for the resistors and capacitors. The ratio of each delay metric to AS/X at each node in each tree was measured. The average, minimum and maximum ratios, along with the standard deviations, are presented in Table III (where Elmore is abbreviated as Elm). Each row represents the results for 100 random trees.

TABLE II

| | Minimum Ratio | | | Maximum Ratio | | | Standard Deviation | | |
|---|---|---|---|---|---|---|---|---|---|
| Node | D2M | Elmore | DM1 | D2M | Elmore | DM1 | D2M | Elmore | DM1 |
| 1 | 0.996 | 3.287 | 1.990 | 26.282 | 121.774 | 65.563 | 3.449 | 16.437 | 8.786 |
| 2 | 1.217 | 2.008 | 1.283 | 6.664 | 19.275 | 10.862 | 0.776 | 2.277 | 1.270 |
| 3 | 1.123 | 1.799 | 1.165 | 2.579 | 5.394 | 3.103 | 0.293 | 0.774 | 0.432 |
| 4 | 1.021 | 1.483 | 1.022 | 1.911 | 3.918 | 2.341 | 0.169 | 0.421 | 0.232 |
| 5 | 1.001 | 1.386 | 1.004 | 1.590 | 2.836 | 1.760 | 0.095 | 0.233 | 0.122 |
| 6 | 0.992 | 1.359 | 0.998 | 1.207 | 1.963 | 1.262 | 0.037 | 0.104 | 0.044 |
| 7 | 0.991 | 1.330 | 1.002 | 1.070 | 1.587 | 1.074 | 0.013 | 0.047 | 0.013 |
| 8 | 0.990 | 1.293 | 1.003 | 1.008 | 1.416 | 1.051 | 0.003 | 0.022 | 0.008 |
| 9 | 0.984 | 1.287 | 1.007 | 1.003 | 1.377 | 1.082 | 0.003 | 0.020 | 0.016 |
| 10 | 0.985 | 1.252 | 1.014 | 1.003 | 1.362 | 1.159 | 0.003 | 0.020 | 0.023 |

TABLE III

| # RC | Sinks | Average Ratio | | | Minimum Ratio | | | Maximum Ratio | | | Standard Deviation | | |
|---|---|---|---|---|---|---|---|---|---|---|---|---|---|
| | | D2M | Elm. | DM1 | D2M | Elm | DM1 | D2M | Elm | DM1 | D2M | Elm | DM1 |
| 10 | 2 | 1.058 | 1.522 | 1.096 | 0.983 | 1.268 | 0.999 | 2.134 | 4.227 | 2.546 | 0.147 | 0.432 | 0.207 |
| | 3 | 1.054 | 1.536 | 1.087 | 0.977 | 1.266 | 0.991 | 1.986 | 5.282 | 2.996 | 0.135 | 0.423 | 0.208 |
| | 4 | 1.060 | 1.554 | 1.090 | 0.978 | 1.280 | 0.988 | 4.268 | 9.723 | 5.684 | 0.227 | 0.612 | 0.323 |
| | 5 | 1.046 | 1.519 | 1.066 | 0.977 | 1.274 | 0.986 | 2.187 | 4.174 | 2.538 | 0.128 | 0.349 | 0.175 |
| 20 | 2 | 1.070 | 1.564 | 1.127 | 0.983 | 1.264 | 0.987 | 2.471 | 5.500 | 3.229 | 0.193 | 0.599 | 0.296 |
| | 4 | 1.106 | 1.686 | 1.167 | 0.977 | 1.270 | 0.988 | 3.435 | 8.594 | 4.944 | 0.293 | 0.867 | 0.457 |
| | 7 | 1.079 | 1.618 | 1.119 | 0.979 | 1.275 | .0985 | 2.818 | 6.745 | 3.623 | 0.201 | 0.580 | 0.299 |
| | 10 | 1.079 | 1.618 | 1.114 | 0.979 | 1.278 | 0.985 | 4.193 | 10.166 | 5.878 | 0.227 | 0.597 | 0.318 |
| 50 | 5 | 1.124 | 1.788 | 1.217 | 0.881 | 1.273 | 0.973 | 4.123 | 10.859 | 6.030 | 0.332 | 1.092 | 0.573 |
| | 10 | 1.120 | 1.749 | 1.188 | 0.944 | 1.253 | 0.979 | 4.695 | 11.342 | 6.562 | 0.372 | 1.072 | 0.580 |
| | 15 | 1.102 | 1.694 | 1.153 | 0.973 | 1.259 | 0.979 | 9.261 | 24.315 | 13.885 | 0.36 | 0.913 | 0.498 |
| | 20 | 1.090 | 1.667 | 1.137 | 0.942 | 1.254 | 0.980 | 9.730 | 22.418 | 13.078 | 0.327 | 0.908 | 0.496 |
| 100 | 10 | 1.113 | 1.777 | 1.200 | 0.840 | 1.252 | 0.938 | 5.425 | 16.153 | 9.069 | 0.330 | 1.141 | 0.602 |
| | 20 | 1.111 | 1.760 | 1.185 | 0.864 | 1.260 | 0.967 | 6.795 | 19.551 | 10.899 | 0.350 | 1.178 | 0.629 |
| | 30 | 1.090 | 1.676 | 1.139 | 0.967 | 1.262 | 0.968 | 12.883 | 28.637 | 16.819 | 0.367 | 0.930 | 0.516 |
| | 40 | 1.076 | 1.643 | 1.119 | 0.963 | 1.245 | 0.967 | 8.844 | 23.024 | 13.164 | 0.276 | 0.779 | 0.422 |

It is observed that D2M metric is on average, uniformly more accurate than Elmore and DM1. The maximum error is also uniformly better than the other metrics. The overall accuracy for near end branches is less than for far end branches in some cases because sinks in trees can behave like near-end nodes. D2M is also uniformly dominant with respect to the standard deviation, or stability of results.

The potential applications for the new metric within design optimization are widespread. Applications such as timing-driven placement, interconnect synthesis, and global routing could benefit significantly by using D2M instead of Elmore delay within an optimization loop.

Overall, D2M metric has several advantages over previous approaches:

(1) It is simpler than any of the previously proposed higher order delay metrics, which makes it more amenable for optimization. Its simple form may be suitable for finding optimum algorithm for buffer insertion and wire sizing.

(2) It is significantly more accurate than the closed form metrics. In particular, the D2M metric shows remarkable accuracy at far end nodes. It thus provides a good estimation of the delays throughout the entire circuit.

(3) D2M metric behaves similarly to the Elmore delay metric but with significantly reduced error.

(4) The D2M metric avoids the need to carefully construct a 2-dimensional table model as does, for example, the h-gamma metric. Also, for cases where a circuit designer wants to ensure that timing constraints are met, D2M metric tends to overestimate delay while h-gamma metric can severely underestimate delay at the near-end. Overestimation is preferred for timing analysis. D2M is also more accurate at the far-end nodes (e.g., N8–N10).

Also, D2M is significantly easier to implement and use within an optimization loop than h-gamma.

While the invention has been particularly shown and described with reference to a preferred embodiment, it will be understood by those skilled in the art that various changes in form and detail may be made therein without departing from the spirit and scope of the invention.

What is claimed is:

1. An efficient method for estimating delays at nodes in an RC circuit, said method comprising the steps of:

calculating a first impulse moment and a second impulse moment of an RC circuit;

computing a circuit delay value at each node of said RC circuit utilizing said first and second impulse moments by multiplying a natural logarithm of 2 with a division of a squared power of the first impulse moment by a square root of the second impulse moment; and determining, based on said circuit delay value, whether said RC circuit meets a desired optimization condition.

2. The method of claim 1, wherein said calculating step includes the step of determining a value of said R and said C at said each node.

3. The method of claim 1, wherein said desired optimization condition in said determining step is a maximum delay value for said each node, and said determining step further comprises the step of comparing said circuit delay value with said maximum delay value, wherein said RC circuit meets said desired optimization condition when said circuit delay value is less than said maximum delay value.

4. The method of claim 1, further comprising the step of adjusting circuit elements of said RC circuit to cause a later calculated circuit delay value to be less than said maximum delay value, when said circuit delay value does not meet said desired optimization condition.

5. A computer program product for estimating delays at nodes in an RC circuit, said program product comprising:

a computer readable medium; and program instructions on said computer readable medium for:

calculating a first impulse moment and a second impulse moment of an RC circuit;

computing a circuit delay value at each node of said RC circuit utilizing said first and second impulse moments by multiplying a natural logarithm of 2 with a division of a squared power of the first impulse moment by a square root of the second impulse moment; and determining, based on said circuit delay value, whether said RC circuit meets a desired optimization condition.

6. The computer program product of claim 5, wherein said program instructions for said computing step includes program instructions for determining a value of said R and said C at said each node.

7. The computer program product of claim 5, wherein said desired optimization condition in said program instructions for said determining step is a maximum delay value for said each node, and said program instructions for said determining step further comprises program instructions for comparing said circuit delay value with said maximum delay value, wherein said RC circuit meets said desired optimization condition when said circuit delay value is less than said maximum delay value.

8. The computer program product of claim 5, further comprising program instructions for adjusting circuit elements of said RC circuit to cause a later calculated circuit delay value to be less than said maximum delay value, when said circuit delay value does not meet said desired optimization condition.

9. A data processing system for estimating delays at nodes in an RC circuit, said data processing system comprising:
  a processor;
  an input and output mechanism coupled to said processor; and
  program code stored within a medium accessible by said processor for:
    calculating a first impulse moment and a second impulse moment of an RC circuit,
    computing a circuit delay value at each node of said RC circuit utilizing said first and second impulse moments by multiplying a natural logarithm of 2 with a division of a squared power of the first impulse moment by a square root of the second impulse moment; and
    outputting said circuit delay value utilizing output mechanism.

10. The data processing system of claim 9, further comprising program code for:
  accepting a user inputted desired optimization condition via said input mechanism; and
  determining, based on said circuit delay value, whether said RC circuit meets said desired optimization condition.

11. The data processing system of claim 10, wherein said desired optimization condition in said determining step is a maximum delay value for said each node, and said program code for said determining step further comprises program code for comparing said circuit delay value with said maximum delay value, wherein said RC circuit meets said desired optimization condition when said circuit delay value is less than said maximum delay value.

12. The data processing system of claim 10, wherein said out mechanism comprises a graphical user interface, which identifies said each node and a corresponding delay value at said each node, and whereby circuit topology is visually manipulated.

13. The data processing system of claim 9, wherein said program code for said calculating step includes the program code for determining a value of said R and said C at said each node.

14. The data processing system of claim 9, further comprising program code for accepting adjustments to circuit elements of said RC circuit to cause a later calculated circuit delay value to be less than said maximum delay value, when said circuit delay value does not meet said desired optimization condition.

15. The data processing system of claim 9, further comprising program code for generating RC circuit topology based on values of circuit components and circuit parameters entered at said input mechanism.

* * * * *

UNITED STATES PATENT AND TRADEMARK OFFICE
CERTIFICATE OF CORRECTION

PATENT NO.     : 6,434,729 B1
DATED          : August 13, 2002
INVENTOR(S)    : Alpert et al.

It is certified that error appears in the above-identified patent and that said Letters Patent is hereby corrected as shown below:

Column 12,
Line 3, please delete "out mechanism" and replace with -- output mechanism --.

Signed and Sealed this

Twentieth Day of May, 2003

JAMES E. ROGAN
*Director of the United States Patent and Trademark Office*